US012701958B2

(12) United States Patent
Raschke et al.

(10) Patent No.: US 12,701,958 B2
(45) Date of Patent: Aug. 4, 2026

(54) RETICLE POD HAVING COATED SENSOR ZONES

(71) Applicant: ENTEGRIS, INC., Billerica, MA (US)

(72) Inventors: Russ V. Raschke, Chanhassen, MN (US); Huaping Wang, Eden Prairie, MN (US)

(73) Assignee: ENTEGRIS, INC., Billerica, MA (US)

( * ) Notice: Subject to any disclaimer, the term of this patent is extended or adjusted under 35 U.S.C. 154(b) by 1084 days.

(21) Appl. No.: 17/232,581

(22) Filed: Apr. 16, 2021

(65) Prior Publication Data

US 2021/0327734 A1 Oct. 21, 2021

Related U.S. Application Data

(60) Provisional application No. 63/011,581, filed on Apr. 17, 2020.

(51) Int. Cl.
| | |
|---|---|
| *H10P 72/10* | (2026.01) |
| *B65D 25/34* | (2006.01) |
| *C23C 14/22* | (2006.01) |
| *C23C 14/34* | (2006.01) |
| *C23C 16/44* | (2006.01) |
| *C23C 16/50* | (2006.01) |
| *G03F 1/66* | (2012.01) |

(52) U.S. Cl.
CPC .......... *H10P 72/1906* (2026.01); *C23C 14/22* (2013.01); *C23C 14/34* (2013.01); *C23C 16/44* (2013.01); *C23C 16/50* (2013.01); *G03F 1/66* (2013.01); *H10P 72/1911* (2026.01)

(58) Field of Classification Search
CPC ............. H10P 72/0606; H10P 72/1902; H10P 72/1906; H10P 72/1911; G03F 1/22; G03F 1/66; G03F 7/70741; C23C 14/22; C23C 14/35; C23C 14/44; C23C 14/50; H01L 21/67353; H01L 21/67359; H01L 21/67366; H01L 21/67383
USPC .................................................. 206/454, 710
See application file for complete search history.

(56) References Cited

U.S. PATENT DOCUMENTS

| | | | | |
|---|---|---|---|---|
| 5,894,056 A | * | 4/1999 | Kakizaki | G03F 9/7011 |
| | | | | 355/68 |
| 6,355,946 B1 | | 3/2002 | Ishinaga | |
| 6,948,619 B2 | | 9/2005 | Su | |
| 7,453,549 B2 | * | 11/2008 | Suzuki | G03F 9/7084 |
| | | | | 355/75 |
| 8,603,632 B2 | | 12/2013 | Extrand | |

(Continued)

FOREIGN PATENT DOCUMENTS

| | | |
|---|---|---|
| CN | 104517878 A | 4/2015 |
| EP | 1806774 A1 | 7/2007 |

(Continued)

*Primary Examiner* — Luan K Bui

(57) ABSTRACT

Sensor zones are created on an inner pod of a reticle container using a dry coating method. The sensor zones are discrete zones having a specific spectral reflectivity. The sensor zones are positioned such that they can be read by a tool to determine distance of portions of the pod. The use of discrete zones and a dry coating method for applying those discrete zones overcomes issues with inconsistency and difficulty in cleaning or maintaining reflectance of an inner pod of the reticle container in comparison with inner pods plated entirely with material or other wet coating applied materials.

10 Claims, 4 Drawing Sheets

(56)  References Cited

U.S. PATENT DOCUMENTS

| 10,593,577 B2 * | 3/2020 | Raschke ........... H01L 21/67359 |
| 10,607,871 B2 * | 3/2020 | Chiu ................... G03F 7/70741 |
| 10,670,976 B2 * | 6/2020 | Hsueh ................ G03F 7/70741 |
| 2005/0230666 A1 | 10/2005 | Otsuka |
| 2006/0260978 A1 | 11/2006 | Gregerson |
| 2007/0076292 A1 | 4/2007 | Su |
| 2012/0175279 A1 * | 7/2012 | Ku ...................... G03F 7/70741 |
| | | 206/454 |
| 2016/0085144 A1 | 3/2016 | Chen et al. |
| 2018/0210349 A1 * | 7/2018 | Hsueh .............. H01L 21/67353 |
| 2019/0214287 A1 * | 7/2019 | Chiu ................... G03F 7/70741 |

FOREIGN PATENT DOCUMENTS

| EP | 2144119 A1 | 1/2010 |
| JP | H0743893 A | 2/1995 |
| JP | H0936214 A | 2/1997 |
| JP | H10320959 A | 12/1998 |
| JP | 2000340642 A | 12/2000 |
| TW | 200839465 A | 10/2008 |
| TW | 201915603 A | 4/2019 |
| TW | 202004962 A | 1/2020 |
| WO | 0057127 A1 | 9/2000 |
| WO | 2016121635 A1 | 8/2016 |

* cited by examiner

100
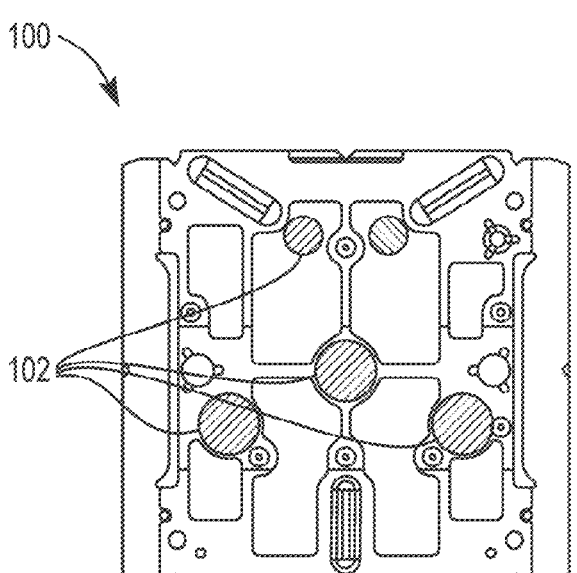
102
Figure 1A
150
156
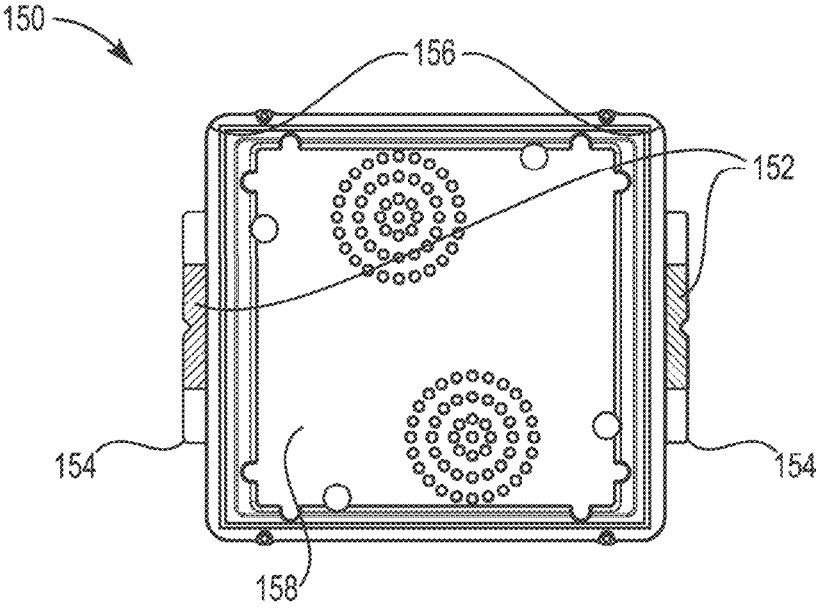
152
154
154
158
Figure 1B
150
154
152
Figure 1C

RETICLE POD HAVING COATED SENSOR ZONES

CROSS-REFERENCE TO RELATED APPLICATION

This application claims the benefit of and priority to U.S. Provisional Application No. 63/011,581, filed on Apr. 17, 2020 which is incorporated herein by reference in its entirety for all purposes.

FIELD

This disclosure is directed to reticle pods, particularly the formation of sensor zones on reticle pods such as extreme ultraviolet (EUV) reticle pods.

BACKGROUND

Reticle pods are used to contain photolithography masks used during semiconductor processing, such as during extreme ultraviolet (EUV) treatment. The reticle pod can include a metal inner pod which is handled and manipulated by one or more tools during the processing. Some of the tools may use reflectance to determine the distance of the inner pod from one or more sensors within the tool. Reticle pods are typically cleaned using deionized (DI) water, which can lead to oxidation of some materials.

The inner pod of the reticle pod can be wet coated with chromium to improve the reflectance and appearance and to resist losses in reflectance from oxidation caused by DI water cleaning. However, the shape of the reticle pod causes difficulty in wet coating.

SUMMARY

This disclosure is directed to reticle pods, particularly the formation of sensor zones on reticle pods such as extreme ultraviolet (EUV) reticle pods.

By using a dry coating process to selectively apply a reflective coating to discrete sensor zones on the reticle pod, reflective material can be provided to interface with the sensors on a process tool without requiring wet coating of the entire reticle pod. In addition, the reflective coating can be provided such that it has a desired thickness and strength.

In an embodiment, a pod includes a baseplate having a baseplate surface. The baseplate surface includes a baseplate surface material and a reflective material. The reflective material of the baseplate surface is disposed in one or more discrete baseplate sensor zones. The pod also includes a cover having a cover surface. The cover surface includes a cover surface material and the reflective material. The reflective material of the cover surface is disposed in one or more cover sensor zones.

In an embodiment, the pod is a EUV reticle pod. In an embodiment, the pod further includes an outer pod dome and an outer pod door, the pod dome and the pod door configured to accommodate the baseplate and the cover within the pod dome when the door is attached to the pod dome.

In an embodiment, the reflective material has a spectral reflectivity at a wavelength of 880 nm of between approximately 50% and approximately 70%. In an embodiment, the reflective material includes chromium. In an embodiment, only the reflective material includes the chromium.

In an embodiment, the one or more baseplate sensor zones and the one or more cover sensor zones are positioned such that a distance between the pod and a detector can be determined from reading the one or more baseplate sensor zones and the one or more cover sensor zones.

In an embodiment, the baseplate surface includes one of aluminum or nickel and the cover surface is one of aluminum or nickel.

In an embodiment, a method of producing a reticle pod includes applying a reflective material to each of one or more discrete baseplate sensor zones of a baseplate of the reticle pod using a dry coating process, and applying the reflective material to each of one or more discrete cover sensor zones of a cover of the reticle pod using the dry coating process.

In an embodiment, the reflective material has a spectral reflectivity at a wavelength of 880 nm of between approximately 50% and approximately 70%.

In an embodiment, the dry coating process is selected from the group consisting of: physical vapor deposition, sputter deposition, chemical vapor deposition, and plasma-enhanced chemical vapor deposition.

In an embodiment, the one or more baseplate sensor zones and the one or more cover sensor zones are positioned such that a distance between the pod and a detector can be determined from reading the one or more baseplate sensor zones and the one or more cover sensor zones.

DRAWINGS

The disclosure may be more completely understood in consideration of the following description of various illustrative embodiments in connection with the accompanying drawings FIG. 1A shows a bottom plan view of a baseplate of a reticle pod according to an embodiment.

FIG. 1B shows a bottom plan view of a cover of a reticle pod according to an embodiment.

FIG. 1C shows a side view of the cover of the reticle pod shown in FIG. 1B.

Figure 2:
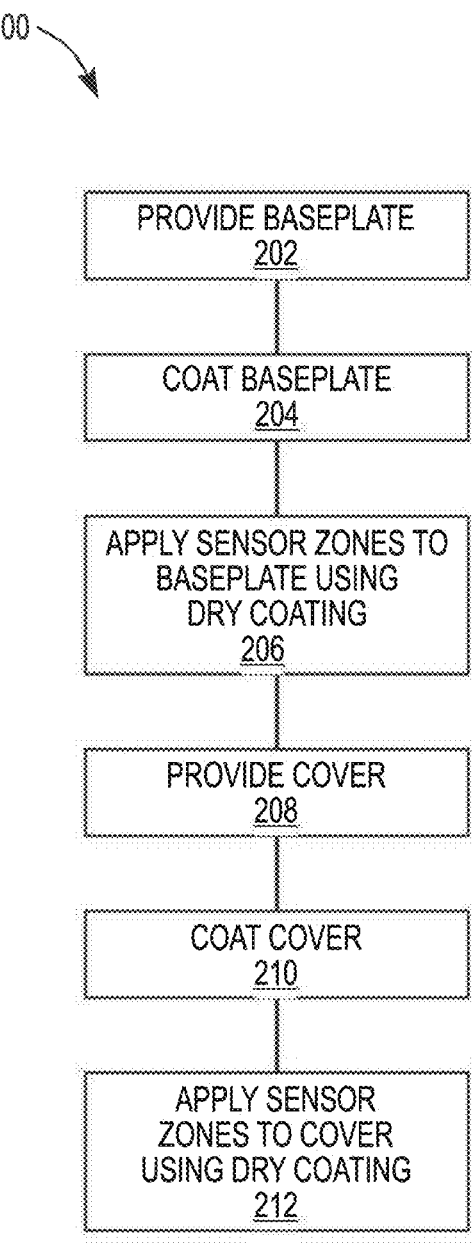
FIG. 2 shows a flowchart of a method of producing a reticle pod according to an embodiment.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DETAILED DESCRIPTION

This disclosure is directed to reticle pods, particularly the formation of sensor zones on reticle pods such as extreme ultraviolet (EUV) reticle pods.

FIG. 1A shows a plan view of a bottom of a baseplate of a reticle pod according to an embodiment. Baseplate 100 forms part of an inner pod of a reticle pod. Baseplate 100 includes one or more sensor zones 102.

Baseplate 100 includes a baseplate surface material forming the surface of the baseplate 100. The baseplate surface material can be a material used in the formation of the baseplate such as aluminum or any other suitable materials for the baseplate 100 of a reticle pod. Baseplate 100 can further include features for manipulating the reticle pod or baseplate 100 in particular. The baseplate surface material can be a coating applied to the baseplate 100 to form the surface of the baseplate 100, such as a nickel coating.

In one or more embodiments, at least one sensor zone 102 can be provided on a surface of the baseplate 100. Sensor zones 102 are discrete zones made of a reflective material. The sensor zones 102 are defined regions of reflective material formed on segments of the surface of baseplate 100. The one or more sensor zones 102 cover areas less than an entire surface of the baseplate 100. The sensor zones 102 can have any suitable shape for presenting reflective material to be read by one or more sensors, such as sensors included in a tool handling the reticle pod including baseplate 100. The sensor zones 102 can include a sensor zone material that can be a different material than the surrounding baseplate material on the surface of baseplate 100. For example, the baseplate 100 may be made of aluminum, with the sensor zone material applied to exposed aluminum material or a nickel coating on baseplate 100 to form the discrete sensor zone 102. In an embodiment, the sensor zone material can be disposed and in contact with a coating applied to a surface material of baseplate 100 to form the discrete sensor zones 102. In an embodiment, the sensor zones 102 can be applied to a coating that is made of a different material than the sensor zone material used in the sensor zones 102. In an embodiment, the sensor zones 102 can be applied to a coating that includes at least some of the same materials as the sensor zones 102, but provided by a different method than dry coating. For example, a chromium coating can be applied to a chromium surface material for baseplate 100, with the sensor zones 102 being formed by applying additional chromium by the dry coating method to provide chromium at different density, thickness, and uniformity within those sensor zones 102 compared to the baseplate surface material that is the wet-coated chromium on nickel.

The sensor zones 102 can be provided on any part of the baseplate 100 where a sensor may attempt to detect the baseplate 100. In an embodiment, the sensor zones 102 are provided on a bottom surface of baseplate 100 and are visible from a bottom of the reticle pod when the baseplate 100 is assembled with a cover, such as cover 150 shown in FIG. 1B and described below. In an embodiment, one sensor zone 102 is included on baseplate 100. In an embodiment, a plurality of sensor zones 102 are included on the baseplate. In an embodiment, the sensor zones 102 are located on a bottom surface of baseplate 100 such that they are not obscured by a cover such as cover 150 shown in FIGS. 1B and 1C when a reticle pod including baseplate 100 is assembled. In the embodiment shown in FIG. 1A, four sensor zones 102 are provided on baseplate 100, with the four sensor zones 102 provided on a bottom surface of the baseplate 100.

The reflective material used in sensor zones 102 has a known spectral reflectance selected for use with a detection system of a tool using the pod including baseplate 100. In some embodiments, the reflective material can have a reflectance different from that of the baseplate surface material, such as being greater than or less than that of the baseplate surface material. The sensor zones 102 can provide spectral reflectance at one or more predetermined wavelengths that are within a known, predetermined range such that the light reflected by the sensor zones 102 is associated with a particular distance of the inner pod baseplate 100 from a reference with a tool using the reticle such as, for example, an extreme ultra-violet (EUV) tool for processing wafers. As a non-limiting example, the range for the spectral reflectance of each of the sensor zones 102 is between approximately 57% and approximately 63% for at least one of the one or more predetermined wavelengths. In an embodiment, each of the sensor zones 102 has a spectral reflectance at a wavelength of 880 nm that is between approximately 57% and approximately 63%. The sensor zones can include any suitable reflective material having the desired spectral reflectance properties and capable of being applied by the dry coating method. The reflective material can be an inert material selected such that it does not react during processing by the tool. The reflective material can, as a non-limiting example, include chromium. In an embodiment, only the one or more sensor zones 102 and 152 included in a reticle pod include chromium.

The reflective material can be provided in sensor zones 102 by a dry coating method, such as physical vapor deposition (PVD), sputter deposition, chemical vapor deposition (CVD), and plasma-enhanced chemical vapor deposition (PE-CVD). The resulting sensor zones 102 can have a more durable and uniform coating within those sensor zones 102 compared to wet coating methods such as plating of the entire baseplate 100. The improved durability can in turn improve the appearance and maintenance of proper reflectivity for the sensor zones 102.

FIG. 1B shows a plan view of a bottom surface of a cover 150 of a reticle pod according to an embodiment, and FIG. 1C shows a side view of the cover 150 of the reticle pod shown in FIG. 1B. Cover 150 includes sensor zones 152.

Cover 150 is configured to be joined to a baseplate, such as baseplate 100 shown in FIG. 1A, to form a reticle pod that is configured to accommodate a reticle. Cover 150 can be configured such that reticle containment portion 158 is enclosed by the baseplate 100. Cover 150 can further include features for manipulating the reticle pod or cover 150 in particular. Cover 150 can be made of any suitable material, such as aluminum. The surface of cover 150 is a cover surface material, which can be the material forming the body of the cover 150 or a coating, such as nickel formed on that material.

One or more sensor zones 152 can be provided on the cover 150, in addition to or instead of the sensor zones 102 provided on baseplate 100. The one or more sensor zones 152 are discrete zones including a reflective material. The one or more sensor zones 152 cover areas less than an entire surface of the cover 150. The reflective material can be applied by a dry coating process. The sensor zones 152 can have any suitable shape for presenting reflective material to be read by one or more sensors, such as sensors included in a tool handling the reticle pod including cover 150. The sensor zones 152 can use the same or different reflective materials from sensor zones on a baseplate to be used with the cover 150, such as that of sensor zones 102 on baseplate 100 shown in FIG. 1A. The one or more sensor zones can be provided on cover 150 such that the one or more sensor zones can be read by a tool when the cover 150 is combined with a baseplate, such as baseplate 100, to form an inner pod of a reticle pod. In an embodiment, the sensor zones 152 are located such that they are not obscured by a baseplate such as baseplate 100 shown in FIG. 1A when a reticle pod including the baseplate and cover 150 is assembled. In the embodiment shown in FIGS. 1B and 1C, four sensor zones 152 are provided, with two of the sensor zones 152 being on bottom surfaces of extensions 154 from the sides 156 of the cover as visible in FIG. 1B, and two sensor zones on outward-facing side surfaces of cover 150 as visible in FIG. 1C.

The reflective material used in sensor zones 152 has a known spectral reflectance selected for use with a detection system of a tool using the pod including cover 150. The reflective material can be an inert material selected such that it does not react during processing by the tool. The sensor zones 152 can provide spectral reflectance at one or more predetermined wavelengths that are within a known, predetermined range such that the light reflected by the sensor zones 152 is associated with a particular distance of the inner pod cover 150 from a reference with a tool such as an extreme ultra-violet (EUV) tool for processing wafers using the reticle. As a non-limiting example, the range for the spectral reflectance of each of the sensor zones 152 is between approximately 57% and approximately 63% for at least one of the one or more predetermined wavelengths. In an embodiment, each of the sensor zones 152 has a spectral reflectance at a wavelength of 880 nm that is between approximately 57% and approximately 63%. The sensor zones 152 can include any suitable reflective material having the desired spectral reflectance properties and capable of being applied by the dry coating method. The reflective material can be an inert material selected such that it does not react during processing by the tool. The reflective material can, as a non-limiting example, include chromium. In an embodiment, only the one or more sensor zones 102 and 152 included in a reticle pod include chromium.

The reflective material can be provided in sensor zones 152 by a dry coating method, such as physical vapor deposition (PVD), sputter deposition, chemical vapor deposition (CVD), and plasma-enhanced chemical vapor deposition (PE-CVD). The resulting sensor zones 152 can have a more durable and uniform coating within those sensor zones 152 compared to wet coating methods such as plating of the entire cover 150. The improved durability can in turn improve appearance and maintenance of proper reflectivity for the sensor zones 152.

Cover 150 can include further features for the function of the reticle pod it is included in. For example, cover 150 can include a reticle containment portion 154 forming part of an internal space configured to accommodate a reticle such as a photolithography mask.

FIG. 2 shows a flowchart of a method of producing a reticle pod according to an embodiment. Method 200 includes providing a baseplate 202, optionally coating the baseplate 204, applying reflective material to one or more sensor zones on the baseplate using a dry coating method 206, providing a cover 208, optionally coating the cover 210, and applying reflective material to one or more sensor zones on the cover using a dry coating method 212. Some embodiments of the method may also include a polishing step in which the one or more sensor zones are polished to achieve a desired spectral reflectivity.

A baseplate can be provided at 202. The baseplate is a formed baseplate for use in a reticle pod. The baseplate can be any suitable material for a reticle pod baseplate, such as, as a non-limiting example, aluminum. The baseplate provided at 202 can include all the features of a completed baseplate, such as walls defining the reticle containing portion, reticle supports, features for engaging with a cover, features for engaging with automation within a tool using or manipulating the reticle, and the like, at the time that baseplate is provided at 202.

The baseplate can optionally be coated at 204. The coating can be any suitable coating to be applied to the baseplate, such as coatings to improve the appearance, provide wear resistance, provide an inert surface compatible with use in the processing tool, or any other desired function of such a coating. The coating applied at 204 can be through a wet coating process, such as plating or any other coating method including submersion of the baseplate within a liquid. One or more such coatings can be applied to the baseplate at 204. One of the coatings applied to the baseplate at 204 can be nickel.

In some embodiments, reflective material can be applied to one or more discrete locations on the baseplate to form sensor zones using a dry coating method at 206. The dry coating method can be any method that does not include applying a liquid to the baseplate during coating. The dry coating method can be, as non-limiting examples, physical vapor deposition (PVD), sputter deposition, chemical vapor deposition (CVD), and plasma-enhanced chemical vapor deposition (PE-CVD). The one or more sensor zones to which the reflective material is applied at 206 are discrete zones, and these discrete zones make up less than an entire surface of the baseplate. The one or more sensor zones can be defined through, for example, a mask being applied during deposition by the dry coating method, with the mask allowing deposition only on the one or more sensor zones.

The reflective material applied to the baseplate at 206 has a known spectral reflectance selected for use with a detection system of a tool using the pod including the baseplate. The reflective material can be an inert material selected such that it does not react during use of the reticle pod within the tool. The reflective material can, as a non-limiting example, include chromium. The reflective material can be applied to the sensor zones such that the sensor zones provide spectral reflectance at one or more predetermined wavelengths that are within a known, predetermined range such that the light reflected by the sensor zones is associated with a particular distance of the inner pod baseplate from a reference with a tool such as an extreme ultra-violet (EUV) tool for processing using reticles. As a non-limiting example, the range for the spectral reflectance of each of the sensor zones is between approximately 50% and approximately 70% for at least one of the one or more predetermined wavelengths. In an embodiment, each of the sensor zones has a spectral reflectance at a wavelength of 880 nm that is between approximately 50% and approximately 70%.

A cover is provided at 208. The cover is a formed cover for a reticle pod. The cover can be any suitable material for a reticle pod cover, such as, as a non-limiting example, aluminum. The cover provided at 208 can include all the features of a completed cover, such as walls defining the reticle containing portion, features for engaging with a baseplate, features for engaging with automation within the tool using the reticle, and the like, at the time that cover is provided at 208.

Optionally, the cover is coated at 210. The coating can be any suitable coating to be applied to the cover, such as coatings to improve the appearance, provide wear resistance, provide an inert surface compatible with use in processing using the reticle, or any other desired function of such a coating. The coating applied at 210 can be through a wet coating process, such as plating or any other coating method including submersion of the cover within a liquid. One or more such coatings can be applied the cover at 210. The one or more coatings applied to the cover at 210 can be the same coatings as those applied to the baseplate at 204. The one or more coatings applied to the cover at 210 can include one or more coatings that differ from the one or more coatings applied to the baseplate at 204. One of the coatings applied at 210 can be nickel.

In some embodiments, reflective material can be applied to one or more discrete locations on the cover to form sensor zones using a dry coating method at 212. The dry coating method can be any method that does not include applying a liquid to the cover during coating. The dry coating method can be, as non-limiting examples, physical vapor deposition (PVD), sputter deposition, chemical vapor deposition (CVD), and plasma-enhanced chemical vapor deposition (PE-CVD). The one or more sensor zones to which the reflective material is applied at 212 are discrete zones, and these discrete zones make up less than an entire surface of the cover. The one or more sensor zones can be defined through, for example, a mask being applied during deposition by the dry coating method, with the mask allowing deposition only on the one or more sensor zones.

The reflective material applied to the cover at 212 has a known spectral reflectance selected for use with a detection system of a tool using the pod including the cover. The reflective material can be an inert material selected such that it does not react when the reticle is being used. The reflective material can, as a non-limiting example, include chromium. The reflective material can be applied to the sensor zones such that the sensor zones provide spectral reflectance at one or more predetermined wavelengths that are within a known, predetermined range in order to allow the light reflected by the sensor zones to be associated with a particular distance of the inner pod baseplate from a reference with a tool such as an extreme ultra-violet (EUV) tool for processing using reticles. As a non-limiting example, the range for the spectral reflectance of each of the sensor zones is between approximately 50% and approximately 70% for at least one of the one or more predetermined wavelengths. In an embodiment, each of the sensor zones has a spectral reflectance at a wavelength of 880 nm that is between approximately 50% and approximately 70%. In some cases, the sensor zones may be polished to achieve a desired spectral reflectivity.

The baseplate and cover processed during method 200 can be used as the inner pod of a reticle pod for containing a reticle, for example, to contain a photolithography mask that is to be used in extreme ultra-violet (EUV) processing of wafers.

Figure 3:
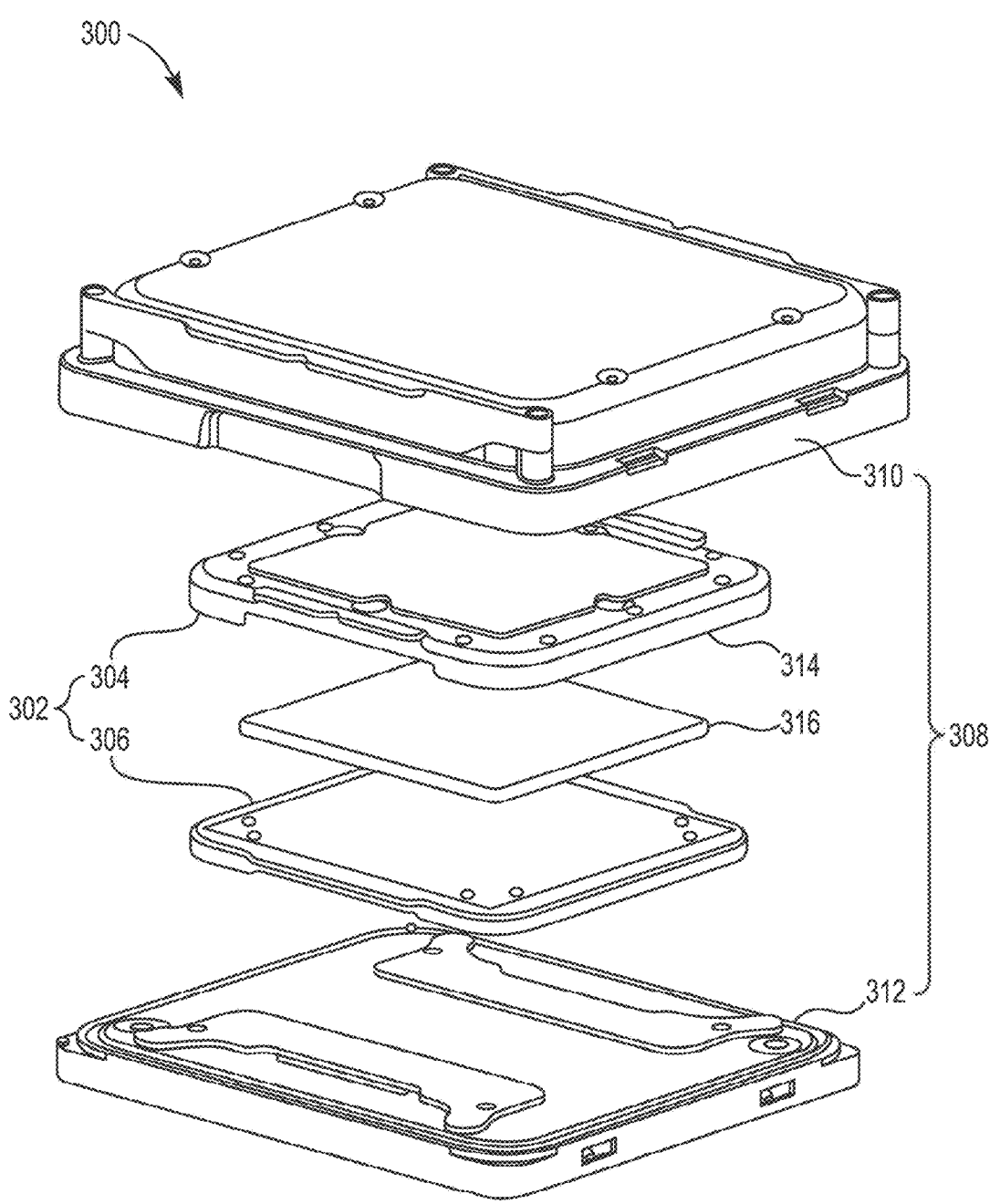
FIG. 3 shows a reticle pod including an outer pod and an inner pod according to an embodiment.

FIG. 3 shows a reticle pod including an outer pod and an inner pod according to an embodiment. Reticle pod 300 includes an inner pod 302, the inner pod 302 including cover 304 and baseplate 306. Reticle pod 300 further includes outer pod 308, which includes outer pod dome 310 and outer pod door 312. Reticle pod 300 can be used to enclose a reticle 316. Reticle 316 can be any suitable reticle, such as, as a non-limiting example, a photolithography mask used in processing of wafers using extreme ultraviolet (EUV).

Inner pod 302 includes cover 304 and baseplate 306. Cover 304 and baseplate 306 are configured to be joined together. Together, cover 304 and baseplate 306 define an internal space sized and shaped to accommodate a reticle, for example a photolithography mask that will be used in extreme ultraviolet (EUV) processing of a wafer. In some embodiments, at least one of the cover 304 and baseplate 306 can each include one or more sensor zones 314, which are discrete zones including a reflective material. In some embodiments, both of cover 304 and baseplate 306 each include one or more of the sensor zones 314. The sensor zones 314 can be the sensor zones 102 and 152 as described above. In the view shown in FIG. 3, sensor zone 314 along a side surface of the cover 304 is visible, with the others hidden by other components when viewed from the perspective of FIG. 3. Other sensor zones 304 can be provided, for example, on side or bottom surfaces not visible in the perspective view of FIG. 3, such as in the positions for sensor zones 102 and 152 shown in FIGS. 1A and 1B. The reflective material can be applied to the sensor zones of cover 304 and baseplate 306 by a dry coating process. Cover 304 can be, for example, cover 150 described above and shown in FIG. 1B. Baseplate 306 can be, for example, baseplate 100 described above and shown in FIG. 1A.

Outer pod 308 is configured to accommodate inner pod 302 within an internal space defined by the outer pod dome 310 and outer pod door 312. Outer pod dome can be secured to outer pod door 312 to enclose the internal space and contain the inner pod 302, for example during transport and handling of reticle pod 300. Outer pod dome 310 and outer pod door 312 can each include or be made entirely of one or more polymer materials.

Figure 4:
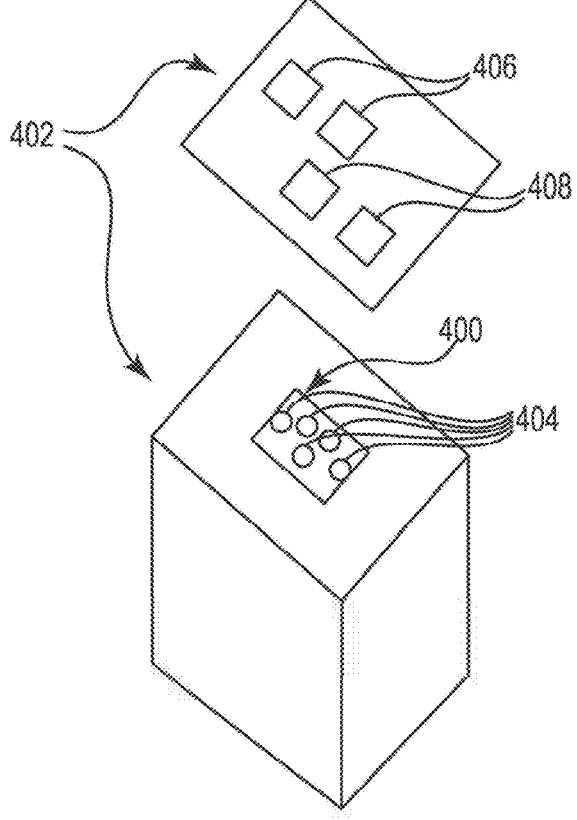
FIG. 4 shows a schematic of a reticle pod in an extreme ultraviolet (EUV) tool according to an embodiment.

FIG. 4 shows a schematic of a reticle pod in an extreme ultraviolet (EUV) tool according to an embodiment. In the embodiment shown in FIG. 4, an inner pod 400 is placed into tool 402.

Inner pod 400 can be any suitable inner pod of a reticle pod, such as inner pod 302, or an inner pod including baseplate 100 and cover 150. Inner pod 400 includes a plurality of sensor zones 404.

Tool 402 can be any suitable tool handling or operating on the inner pod 400. As a non-limiting example, tool 402 can be an extreme ultra-violet (EUV) tool using reticles such as photolithography masks. Tool 402 can be in a vacuum chamber, with inner pod 400 removed from an outer pod (not shown) and placed into the tool 402 within the vacuum chamber. During use of the reticle in tool 402, the cover can be removed from the baseplate of the inner pod 400 to reveal a reticle contained within inner pod 400. Tool 402 includes light sources 406 and detectors 408. The light sources 406 and detectors 408 are positioned such that light provided by the light sources 406 can be reflected by sensor zones 404 towards detectors 408, and the light detected at the detectors 408 can determine a distance to the inner pod 400. The light sources can provide light at one or more predetermined wavelengths, including, as a non-limiting example, 880 nm. The sensor zones 404 of the inner pod 400 can provide a spectral reflectance at the one or more predetermined wavelengths that is within a known, predetermined range in order to allow the light detected at detectors 408 to be associated with a particular distance of the inner pod 400. As a non-limiting example, the range for the spectral reflectance of each of the sensor zones 404 is between approximately 50% and approximately 70% for at least one of the one or more predetermined wavelengths. In an embodiment, each of the sensor zones 404 has a spectral reflectance at 880 nm of between approximately 50% and approximately 70%.

Aspects

It is understood that any of aspects 1-9 can be combined with any of aspects 10-16.

Aspect 1. A pod, comprising:

a baseplate having a baseplate surface, the baseplate surface including a baseplate surface material;

a cover having a cover surface, the cover surface including a cover surface material; and one or more discrete sensor zones, each of the sensor zones including a reflective material, the one or more discrete sensor zones disposed on one or both of the baseplate surface and the cover surface.

Aspect 2. The pod according to aspect 1, wherein the pod is a EUV reticle pod.

Aspect 3. The pod according to aspect 2, further comprising an outer pod dome and an outer pod door, the pod dome and the pod door configured to accommodate the baseplate and the cover within the pod dome when the door is attached to the pod dome.

Aspect 4. The pod according to any of aspects 1-3, wherein the reflective material has a spectral reflectivity at a wavelength of 880 nm of between approximately 50% and approximately 70%.

Aspect 5. The pod according to any of aspects 1-4, wherein the reflective material has a reflectivity that is different from a reflectivity of the baseplate surface material.

Aspect 6. The pod according to any of aspects 1-5, wherein the reflective material includes chromium.

Aspect 7. The pod according to aspect 6, wherein only the reflective material includes the chromium.

Aspect 8. The pod according to any of aspects 1-7, wherein the one or more sensor zones are positioned such that a distance between the pod and a detector can be determined from reading the one or more sensor zones.

Aspect 9. The pod according to any of aspects 1-8, wherein the baseplate surface includes one of aluminum or nickel and the cover surface is one of aluminum or nickel.

Aspect 10. The pod according to any of aspects 1-9, wherein each of the baseplate surface and the cover surface includes one or more of the discrete sensor zones.

Aspect 11. A method of producing a reticle pod, comprising:

applying a reflective material to each of one or more discrete sensor zones on one of a baseplate of the reticle pod or a cover of the reticle pod using a dry coating process.

Aspect 12. The method according to aspect 11, wherein the reflective material has a spectral reflectivity different from a spectral reflectivity of the baseplate and a spectral reflectivity of the cover.

Aspect 13. The method according to any of aspects 11-12, wherein the reflective material has a spectral reflectivity at a wavelength of 880 nm of between approximately 50% and approximately 70%.

Aspect 14. The method according to any of aspects 11-13, wherein the one of the baseplate or the cover includes a surface material, the reflective material having a reflectivity that is different from a reflectivity of the surface material.

Aspect 15. The method according to any of aspects 11-14, further comprising applying a coating to the one of the baseplate and the cover.

Aspect 16. The method according to any of aspects 11-15, wherein the dry coating process is selected from the group consisting of: physical vapor deposition, sputter deposition, chemical vapor deposition, and plasma-enhanced chemical vapor deposition.

Aspect 17. The method according to any of aspects 11-16, wherein the one or more baseplate sensor zones and the one or more cover sensor zones are positioned such that a distance between the pod and a detector can be determined from reading the one or more baseplate sensor zones and the one or more cover sensor zones.

Aspect 18. The method according to any of aspects 11-17, further comprising applying the reflective material to each of one or more discrete sensor zones on the baseplate of the reticle pod or the cover of the reticle pod using the dry coating process.

The examples disclosed in this application are to be considered in all respects as illustrative and not limitative. The scope of the disclosure is indicated by the appended claims rather than by the foregoing description; and all changes which come within the meaning and range of equivalency of the claims are intended to be embraced therein.

What is claimed is:

1. A pod, comprising:

a baseplate having a baseplate surface, the baseplate surface being outward-facing and including a baseplate surface material;

a cover having a cover surface, the cover surface being an outward-facing and including a cover surface material; and one or more discrete sensor zones, each of the sensor zones including a reflective material, the one or more discrete sensor zones disposed on one or both of the baseplate surface and the cover surface, wherein when joined, the cover and the baseplate are configured to define an internal space to accommodate a reticle, wherein the discrete sensor zones cover less than the entirety of the baseplate surface and/or the cover surface, and wherein each of the one or more discrete sensor zones is formed by a dry coating process.

2. The pod of claim 1, wherein the pod is a EUV reticle pod.

3. The pod of claim 2, further comprising an outer pod dome and an outer pod door, the pod dome and the pod door configured to accommodate the baseplate and the cover within the pod dome when the door is attached to the pod dome.

4. The pod of claim 1, wherein the reflective material has a spectral reflectivity at a wavelength of 880 nm of between approximately 50% and approximately 70%.

5. The pod of claim 1, wherein the reflective material has a reflectivity that is different from a reflectivity of the baseplate surface material.

6. The pod of claim 1, wherein the reflective material includes chromium.

7. The pod of claim 6, wherein only the reflective material includes the chromium.

8. The pod of claim 1, wherein the one or more discrete sensor zones disposed on the baseplate surface are positioned such that a distance between the pod and a detector can be determined from reading the one or more sensor zones.

9. The pod of claim 1, wherein the baseplate surface includes one of aluminum or nickel and the cover surface is one of aluminum or nickel.

10. The pod of claim 1, wherein each of the baseplate surface and the cover surface includes one or more of the discrete sensor zones.

* * * * *